(12) United States Patent
Abdulaziz et al.

(10) Patent No.: US 12,512,789 B2
(45) Date of Patent: Dec. 30, 2025

(54) QUADRATURE OSCILLATOR

(71) Applicant: Telefonaktiebolaget LM Ericsson (publ), Stockholm (SE)

(72) Inventors: Mohammed Abdulaziz, Lund (SE); Henrik Sjöland, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 18/706,966

(22) PCT Filed: Nov. 15, 2021

(86) PCT No.: PCT/EP2021/081724
§ 371 (c)(1),
(2) Date: May 6, 2024

(87) PCT Pub. No.: WO2023/083483
PCT Pub. Date: May 19, 2023

(65) Prior Publication Data
US 2025/0047240 A1 Feb. 6, 2025

(51) Int. Cl.
*H03B 5/12* (2006.01)
*H03B 5/18* (2006.01)
*H03B 27/00* (2006.01)

(52) U.S. Cl.
CPC ......... *H03B 5/1228* (2013.01); *H03B 5/1243* (2013.01); *H03B 5/1256* (2013.01);
(Continued)

(58) Field of Classification Search
CPC .. H03B 5/1212; H03B 5/1215; H03B 5/1228; H03B 5/1231; H03B 5/124;
(Continued)

(56) References Cited

U.S. PATENT DOCUMENTS 6,121,850 A * 9/2000 Ghoshal ................. H03B 27/00
331/181
7,146,140 B2 * 12/2006 Ravi ..................... H03B 5/1221
331/136
(Continued)

FOREIGN PATENT DOCUMENTS

WO 2022161604 A1 8/2022

OTHER PUBLICATIONS

Hegazi, E. et al., "A Filtering Technique to Lower LC Oscillator Phase Noise", IEEE Journal of Sold-State Circuits, vol. 36, No. 12, Dec. 2001, pp. 1921-1930, IEEE.
(Continued)

*Primary Examiner* — Levi Gannon
(74) *Attorney, Agent, or Firm* — COATS & BENNETT, PLLC

(57) ABSTRACT

A quadrature oscillator according to the embodiments herein comprising two pairs of main transistors, two pairs of resonators and two pairs of injection transistors. The quadrature oscillator is split into two halves, which are separated in the chip layout. That is the two pairs of resonators are separated from each other, and the two pairs of the main transistors are separated from the resonator they coupled to such that the quadrature oscillator is separated into two spaced apart oscillator halves connected by transmission lines.

16 Claims, 13 Drawing Sheets

(52) U.S. Cl.
CPC ........... *H03B 5/1852* (2013.01); *H03B 27/00* (2013.01); *H03B 2200/0078* (2013.01)

(58) Field of Classification Search
CPC .. H03B 5/1243; H03B 5/1256; H03B 5/1265; H03B 5/18; H03B 5/1841; H03B 5/1847; H03B 5/1852; H03B 27/00; H03B 2200/0078
See application file for complete search history.

(56) References Cited

U.S. PATENT DOCUMENTS

| | | | | |
|---|---|---|---|---|
| 7,239,209 | B2* | 7/2007 | Adan | H03B 5/1215 |
| | | | | 331/117 FE |
| 9,484,858 | B1* | 11/2016 | Kalia | H03B 5/1215 |
| 9,923,599 | B1* | 3/2018 | Xue | H03B 27/00 |
| 2004/0061563 | A1* | 4/2004 | Akeyama | H03B 27/00 |
| | | | | 331/117 R |
| 2005/0035823 | A1* | 2/2005 | Lee | H03K 3/354 |
| | | | | 331/167 |
| 2008/0238559 | A1* | 10/2008 | Kuwano | H03B 5/124 |
| | | | | 331/109 |
| 2009/0273403 | A1* | 11/2009 | Ismailov | H03B 27/00 |
| | | | | 331/55 |
| 2010/0233976 | A1* | 9/2010 | Hoshino | H03B 5/1228 |
| | | | | 455/119 |
| 2012/0262239 | A1* | 10/2012 | Taghivand | H03B 19/14 |
| | | | | 331/16 |
| 2013/0099871 | A1 | 4/2013 | Wang | |
| 2015/0084703 | A1 | 3/2015 | Sanduleanu et al. | |
| 2019/0326856 | A1* | 10/2019 | Shiraishi | H03B 5/1212 |

OTHER PUBLICATIONS

Casha, O. et al., "Comparative study of gigahertz CMOS LC quadrature voltage-controlled oscillators with relevance to phsae noise", Analog. Integr. Circ. Sig. Process, May 2007, 52:1-14, pp. 1-14, Springer.

Chang, H. et al., "Design and Analysis of CMOS Low-Phase-Noise Low Quadrature Error V-Band Subharmonically Injection-Locked Quadrature FLL", IEEE Transactions on Microwave Theory and Techniques, vol. 66, No. 6, Jun. 2018, pp. 2851-2866, IEEE.

* cited by examiner

QUADRATURE OSCILLATOR

TECHNICAL FIELD

Embodiments herein relate to a quadrature oscillator, and to a transceiver, an electronic device, and an integrated circuit comprising the quadrature oscillator.

BACKGROUND

Wireless communication systems usually comprise transmitter and receiver circuits, i.e. transceivers, including several frequency conversion steps. The transmitter circuits typically up-convert baseband signals to radio frequency (RF) signals for transmission, and the receiver circuits down-convert received RF signals to baseband signals for processing. Such frequency conversion requires mixers for mixing two signals.

Modern transceiver architectures typically need quadrature local oscillator signals, often to perform mixing to and from quadrature baseband signals. In case of homodyne architectures, which are attractive for their simple signal chain yielding high dynamic range and low amount of spurious frequencies, the quadrature signal is needed at the frequency of communication, which may be very high in 5th generation (5G) and 6G communication systems. The generation of quadrature signals can be implemented by different techniques. If the frequency is below a few tens of GHZ, e.g. in 3G, 4G, and current 5G communication systems, often a frequency divide by two circuit is used, clocked by an oscillator operating at twice the frequency of the output quadrature signal. An advantage of this scheme is that the oscillator is separated in frequency from the signal to receive or transmit, and hence it will be less affected by oscillator pulling. At higher frequencies, i.e. in the high millimetre (mm) wave and sub-THz frequencies planned for 6G communication systems, operating the oscillator at twice the frequency of the output quadrature signal becomes very difficult. The frequency divider design becomes very challenging, and also reaching low phase noise and sufficient frequency tuning range in the oscillator at such high frequencies become very challenging. Then techniques with quadrature hybrids may be used, but since that needs to operate in a characteristic impedance environment, additional power consuming buffer amplifiers are needed, and there will also be some loss in an integrated quadrature hybrid. Similar concerns apply to Resistor-Capacitor (RC) poly-phase filters. Quadrature oscillators are therefore attractive for generating these very high frequency quadrature signals with limited power consumption.

FIG. 1 shows a typical quadrature oscillator 100 with parallel injection according to prior art. The quadrature oscillator 100 comprises two oscillators, Oscillator 1 and Oscillator 2. Each oscillator comprises an inductance-capacitance resonator L1/C1 and a pair of cross-coupled main transistors $M_1/M_2$, $M_3/M_4$. In addition, each oscillator output is connected to the other oscillator with transistors in parallel to the pair of cross-coupled main transistors. That is each oscillator comprises a pair of parallel injection transistors $M_5/M_6$, $M_7/M_8$. The two oscillators can be connected in such a way that a signal from the first oscillator is injected into the second oscillator and a signal from the second oscillator is injected into the first oscillator. The result is that the two oscillators become locked to the same frequency and have a quadrature phase relation. The term "locked" herein represents when two oscillators are locked with an injection current to oscillate at the same frequency and with a certain phase relation for a desired operation. The size of the parallel injection transistors $M_5/M_6$, $M_7/M_8$ may be chosen to be around or larger than half of the size of the cross-coupled main transistors $M_1/M_2$, $M_3/M_4$ to ensure quadrature oscillation.

A problem with quadrature oscillators at high frequencies is that the phase noise will not be as good as for a differential oscillator operating at the same frequency with the same power consumption. At lower frequencies this can be addressed by quadrature oscillators with series coupled injection devices, but at high frequencies that does not work properly, and parallel injection results in a wider current injection interval and hence more phase noise. It also results in worse efficiency compared to a differential oscillator, and larger total devices size and thus parasitics. At high frequencies the device parasitic will not only be capacitive but also have a significant resistive part, degrading the resonator loaded quality factor.

Another problem with quadrature oscillators is that they can oscillate in two different modes, with a 180 degree difference in phase relation between the output signals. Both oscillation modes have a similar probability, and the oscillator can alter between the two modes for instance when changing the frequency tuning. This causes particularly difficult problems in systems with multiple oscillators, and it may also result in frequency gaps that cannot be covered by a particular oscillator, as the frequency typically shifts slightly at the mode change.

Yet another problem is that the quadrature oscillator has a bulky layout with two resonator coils at close proximity. That makes it difficult to create an effective chip layout with low parasitics and couplings when connecting the quadrature oscillator to mixers in multiple signal chains, like a receiver and a transmitter, or two receivers or transmitters. The close proximity of the resonators can also cause coupling between them affecting the quadrature accuracy.

SUMMARY

Therefore, it is an objective of embodiments herein to provide a quadrature oscillator with improved performance.

According to one aspect of embodiments herein, the objective is achieved by a quadrature oscillator for generating two sets of quadrature signals.

The quadrature oscillator comprises a first, a second, a third, a fourth, a fifth, a sixth, a seventh, and an eighth transistor, and a first, a second, a third, and a fourth resonator. The transistors and resonators are connected in the following way:

Gate terminals of the first transistor and the eighth transistor are connected to each other. Gate terminals of the second transistor and the seventh transistor are connected to each other. Gate terminals of the third transistor and the fifth transistor are connected to each other. Gate terminals of the fourth transistor and the sixth transistor are connected to each other. A drain terminal of the fifth transistor is connected to a first terminal of the first resonator. A drain terminal of the sixth transistor is connected to a first terminal of the second resonator. A drain terminal of the seventh transistor is connected to a first terminal of the third resonator. A drain terminal of the eighth transistor is connected to a first terminal of the fourth resonator. A drain terminal of the first transistor is connected to the first terminal of the first resonator through a first transmission line. A drain terminal of the second transistor is connected to the first terminal of the second resonator through a second transmission line. A drain terminal of the third transistor is connected to the first terminal of the third resonator through a third transmission line. A drain terminal of the fourth transistor is connected to the first terminal of the fourth resonator through a fourth transmission line. The gate terminal of the fifth transistor is connected to the first terminal of the fourth resonator through a fifth transmission line. The gate terminal of the sixth transistor is connected to the first terminal of the third resonator through a sixth transmission line. The gate terminal of the seventh transistor is connected to the first terminal of the first resonator through a seventh transmission line. The gate terminal of the eighth transistor is connected to the first terminal of the second resonator through an eighth transmission line.

According to one aspect of embodiments herein, the objective is achieved by an integrated circuit comprising the quadrature oscillator described above. The quadrature oscillator is integrated on a portion of a chip, and the components of the quadrature oscillator are arranged and separated into two sections, a first section and a second section, on the portion of the chip.

The first and second resonators and the third, fourth, fifth and sixth transistors are located in the first section.

The third and fourth resonators and the first, second, seventh and eighth transistors are located in the second section.

A first set of the quadrature signals is provided from one side of the quadrature oscillator located in the first section; and a second set of the quadrature signals is provided from the other side of the quadrature oscillator located in the second section.

In other words, the quadrature oscillator according to embodiments herein has two pairs of main transistors cross coupled via transmission lines to two pairs of resonators respectively forming two cores of the quadrature oscillator. The two cores are coupled by two pairs of parallel injection transistors. The gate terminals of one pair of injection transistors are connected to one core, and the drain currents are injected into the other core. One pair of the injection transistors is cross connected, and the other is not cross connected, which prevents the two cores from locking in phase, and the quadrature oscillator then locks in one of two possible quadrature modes.

Further, the quadrature oscillator according to some embodiments herein is split into two halves, which are separated in the chip layout. That is the two pairs of resonators are separated from each other, and the two pairs of the main transistors are separated from the resonator they are coupled to such that the quadrature oscillator is separated into two spaced apart oscillator halves connected by transmission lines. The parallel injection transistors are located in the same oscillator half as the resonator they are coupled to, and the gate signals are transported by transmission lines from the other half. The main transistors are located in the other half of the oscillator compared to the resonator they are connected to, and transmission lines are thus used for both gate and drain connections.

One benefit of the split layout is that the delay of the transmission lines helps suppress one of the oscillator modes. Separating the two pairs of resonators, i.e. the In-phase (I) and Quadrature (Q) resonator inductances, is also beneficial for quadrature accuracy. A quadrature output signal is available at each half of the oscillator, with small error due to transmission line delay that can be compensated for, which reduces the need for routing when connecting two signal chains to the quadrature oscillator. In general, a system layout with short routing is facilitated by splitting the large oscillator block with two LC resonators.

Therefore, quadrature signals with moderate errors can be extracted from both oscillator halves. In this way, it is simplified in layout when connecting the quadrature oscillator outputs to two different mixers, possibly with some correction to reduce systematic quadrature errors. Furthermore, the transmission line at the drain terminal improves the power gain so that a smaller transistor size can be used, reducing parasitics and thus improving phase noise performance for high oscillator frequencies. In this way, the transmission lines not only serve to transport the signals, but also improve the phase-noise and power performance and reduce the risk for oscillation in an alternate quadrature mode.

Therefore, embodiments herein provide a quadrature oscillator with improved performance.

BRIEF DESCRIPTION OF THE DRAWINGS

Examples of embodiments herein are described in more detail with reference to attached drawings, in which.

DETAILED DESCRIPTION

Figure 1:
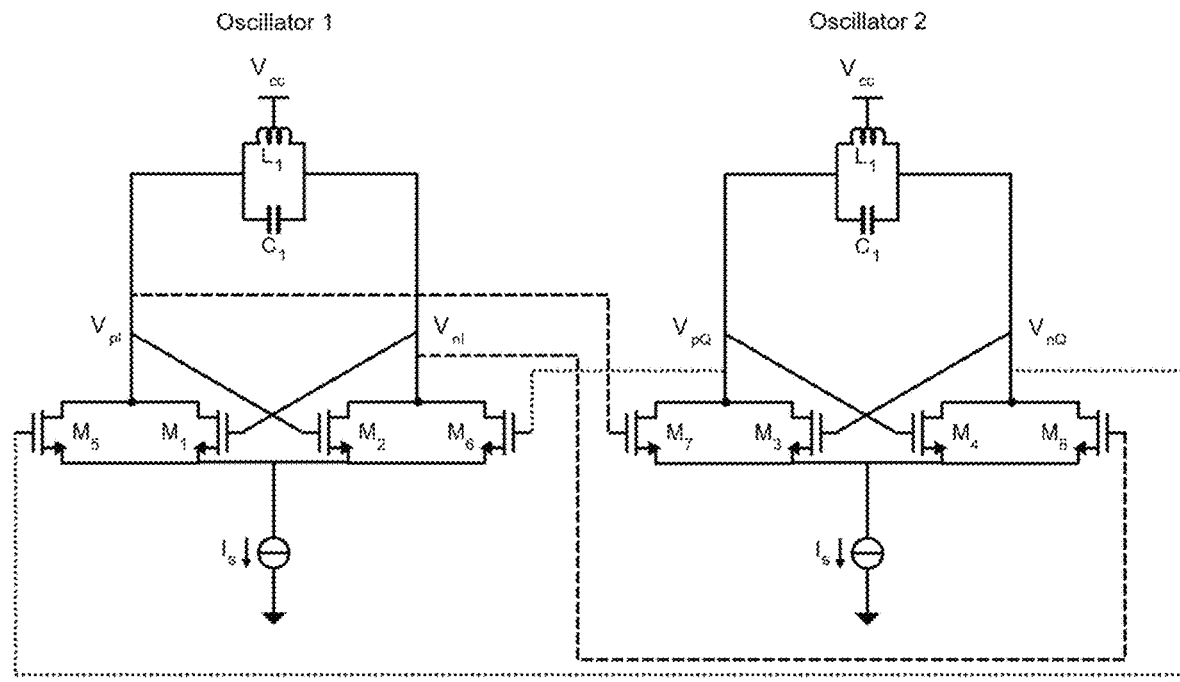
FIG. 1 is a schematic view of a quadrature oscillator according to prior art.
Figure 2:
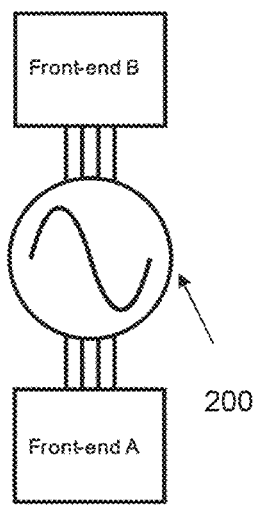
FIG. 2 is block diagram of an example configuration of a quadrature oscillator with connections to two separate front-ends in a transceiver according to embodiments herein.

Low power quadrature oscillators are desirable at high mm-wave frequencies to save energy. Routing signals at such high frequencies can, however, be very expensive in terms of signal loss as well as increased IQ imbalance (IQI). A quadrature oscillator having 8 outputs that are arranged in layout to provide two sets of quadrature signals at two different sides of the quadrature oscillator is proposed according to the embodiments herein. The two sets of the quadrature signals can be used for example to provide local oscillator (LO) signals to two different front-ends in a transceiver. FIG. 2 shows a simplified block diagram showing an example configuration of the proposed quadrature oscillator 200 with connections to two separate front-ends A and B located at each side of the quadrature oscillator 200. Other possible configurations that involve exciting more front-ends, using differential LO-signals, are of course also possible.

Figure 3:
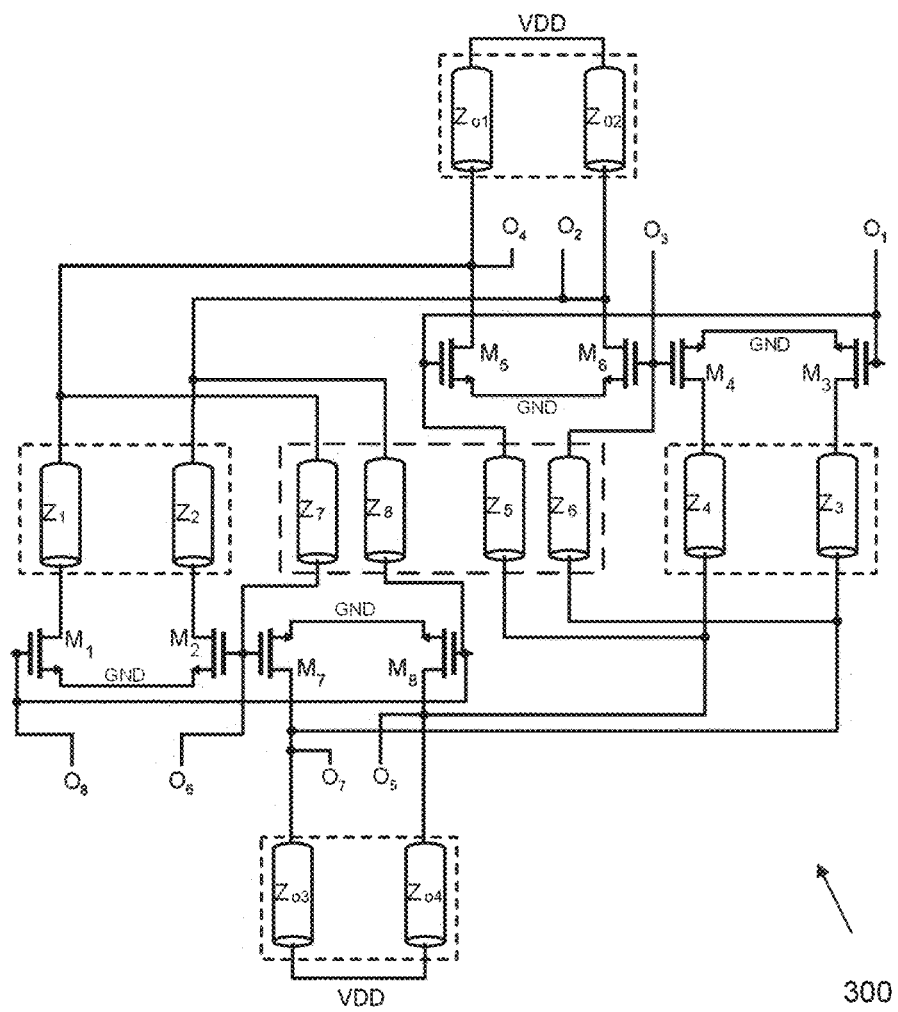
FIG. 3 is a simplified schematic view of a quadrature oscillator according to embodiments herein.

FIG. 3 is a schematic block diagram of a quadrature oscillator 300 for generating two sets of quadrature signals $O_1, O_2, O_3, O_4; O_5, O_6, O_7, O_8$ according to embodiments herein. The quadrature oscillator 300 comprises a first transistor $M_1$, a second transistor $M_2$, a third transistor $M_3$, a fourth transistor $M_4$, a fifth transistor $M_5$, a sixth transistor $M_6$, a seventh transistor $M_7$ and an eighth transistor $M_8$. The first, second, third and fourth transistors $M_1, M_2, M_3, M_4$ are referred to as two pairs of main transistors, i.e. the first and second transistors $M_1, M_2$ are referred to as a first pair of main transistors, the third and fourth transistors $M_3, M_4$ are referred to as a second pair of main transistors, and the fifth, sixth, seventh and eighth transistors $M_5, M_6, M_7, M_8$ are referred to as parallel injection transistors.

The quadrature oscillator 300 further comprises a first resonator $Z_{o1}$, a second resonator $Z_{o2}$, a third resonator $Z_{o3}$ and a fourth resonator $Z_{o4}$.

As shown in FIG. 3, the connections of the transistors and resonators are as follows:

Gate terminals of the first transistor $M_1$ and the eighth transistor $M_8$ are connected to each other.

Gate terminals of the second transistor $M_2$ and the seventh transistor $M_7$ are connected to each other.

Gate terminals of the third transistor $M_3$ and the fifth transistor $M_5$ are connected to each other.

Gate terminals of the fourth transistor $M_4$ and the sixth transistor $M_6$ are connected to each other.

A drain terminal of the fifth transistor $M_5$ is connected to a first terminal of the first resonator $Z_{o1}$.

A drain terminal of the sixth transistor Me is connected to a first terminal of the second resonator $Z_{o2}$.

A drain terminal of the seventh transistor $M_7$ is connected to a first terminal of the third resonator $Z_{o3}$.

A drain terminal of the eighth transistors $M_8$ is connected to a first terminal of the fourth resonator $Z_{o4}$.

A drain terminal of the first transistor $M_1$ is connected to the first terminal of the first resonator $Z_{o1}$ through a first transmission line $Z_1$.

A drain terminal of the second transistor $M_2$ is connected to the first terminal of the second resonator $Z_{o2}$ through a second transmission line $Z_2$.

A drain terminal of the third transistor $M_3$ is connected to the first terminal of the third resonator $Z_{o3}$ through a third transmission line $Z_3$.

A drain terminal of the fourth transistor $M_4$ is connected to the first terminal of the fourth resonator $Z_{o4}$ through a fourth transmission line $Z_4$.

The gate terminal of the fifth transistor $M_5$ is connected to the first terminal of the fourth resonator $Z_{o4}$ through a fifth transmission line $Z_5$.

The gate terminal of the sixth transistor Me is connected to the first terminal of the third resonator $Z_{o3}$ through a sixth transmission line $Z_6$.

The gate terminal of the seventh transistor $M_7$ is connected to the first terminal of the first resonator $Z_{o1}$ through a seventh transmission line $Z_7$.

The gate terminal of the eighth transistor $M_8$ is connected to the first terminal of the second resonator $Z_{o2}$ through an eighth transmission line $Z_8$.

The transistors shown in FIG. 3 are N-channel metal-oxide-semiconductor (NMOS) transistors, then source terminals of the transistors $M_1, M_2, M_3, M_4, M_5, M_6, M_7, M_8$ may be connected to a signal ground GND either directly or through an impedance (not shown), and the second terminals of the resonators $Z_{o1}, Z_{o2}, Z_{o3}, Z_{o4}$ may be connected to a power supply node VDD.

The quadrature oscillator 300 may be implemented by P-channel metal-oxide-semiconductor (PMOS) transistors, then source terminals of the transistors $M_1, M_2, M_3, M_4, M_5, M_6, M_7, M_8$ may be connected to a power supply node VDD either directly or through an impedance, and the second terminals of the resonators $Z_{o1}, Z_{o2}, Z_{o3}, Z_{o4}$ may be connected to a signal ground GND.

The quadrature oscillator 300 may also be implemented by bipolar junction transistors (BJTs) either PNP or NPN transistors. For BJTs, the gate, source, and drain terminals of the transistor referred to herein may also be referred to as base, emitter, and collector terminals, respectively. The quadrature oscillator 300 implemented with BJTs may comprise voltage dividers at the base terminals of the BJTs to avoid turning on the base-collector diodes when base voltage is high and collector voltage is low for NPN transistors and opposite for PNP transistors.

The quadrature oscillator 300 may be tuned to generate the two sets of quadrature signals $O_1, O_2, O_3, O_4, O_5, O_6, O_7, O_8$ with frequency of 30-100 GHz or over 100 GHz. Transmission lines may be used as inductors in the resonators instead of spiral inductors common at lower frequencies. However, spiral inductors may replace the transmission lines in some implementations.

Figure 4:
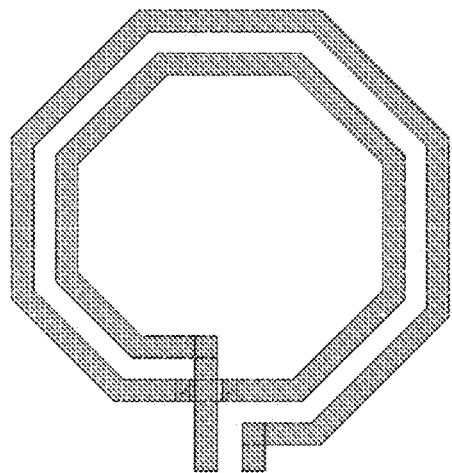
FIG. 4 is an example of a spiral inductor.

Therefore, according to some embodiments herein, the first, second, third and fourth resonators $Z_{o1}, Z_{o2}, Z_{o3}, Z_{o4}$ may be transmission lines acting as inductors. Alternatively, the first, second, third and fourth resonators $Z_{o1}, Z_{o2}, Z_{o3}, Z_{o4}$ may be spiral inductors. FIG. 4 shows an example of a spiral inductor.

Figure 5:
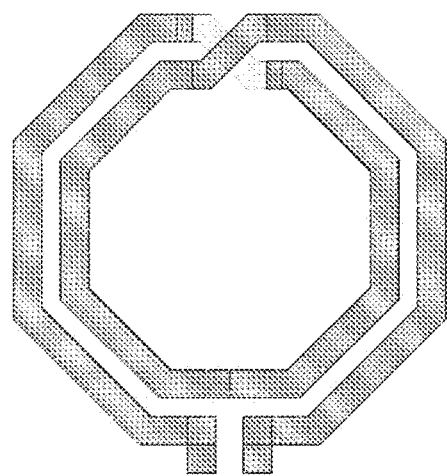
FIG. 5 is an example of a differential spiral inductor.

According to some embodiments herein, the first and second resonators $Z_{o1}, Z_{o2}$ may be implemented as a first differential spiral inductor, and the third and fourth resonators $Z_{o3}, Z_{o4}$ may be implemented as a second differential spiral inductor. FIG. 5 shows an example of a differential spiral inductor.

According to some embodiments herein, the first, second, third and fourth resonators $Z_{o1}, Z_{o2}, Z_{o3}, Z_{o4}$ may be tunable. For example, the first, second, third and fourth resonators $Z_{o1}, Z_{o2}, Z_{o3}, Z_{o4}$ may comprise tunable capacitors, e.g. switched capacitor arrays, voltage controlled capacitors or varactors.

According to some embodiments herein, the transmission lines acting as inductors and all connecting transmission lines may be tunable. That is, the transmission lines $Z_1, Z_2, Z_3, Z_4$ at the drain terminals of the first, second, third and fourth transistors $M_1, M_2, M_3, M_4$ may be tunable. The transmission lines $Z_5, Z_6, Z_7, Z_8$ at the gate terminals of the fifth, sixth, seventh and eighth transistors $M_5, M_6, M_7, M_8$ may be tunable.

A tunable transmission line may be implemented in various ways. An example of a tunable differential transmission line segment is provided herein in FIG. 6. The left drawing in the figure shows a pair of signal line segments 610 as well as a pair of tuning line segments 620 next to each other to better illustrate the various aspects of the principle of the example tunable differential transmission line segment. The right drawing in the figure illustrates a top view of the tunable differential transmission line segment as implemented in a microwave component. Referring to the left drawing, the pair of signal line segments 610 comprises a first signal line 611 and a second signal line 612, both lines implemented as elongated strips. Each line 611 and 612 includes an input terminal In and an output terminal Out, to which other microwave component can be attached.

Figure 6:
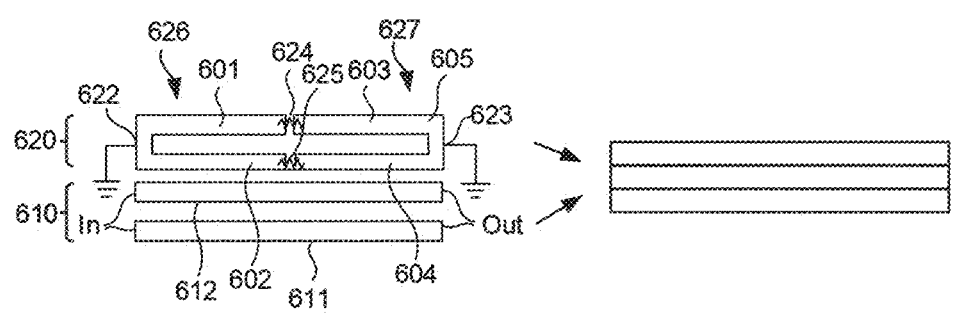
FIG. 6 is a simplified schematic view of an example of a tunable differential transmission line segment.

The pair of tuning lines 620 is divided into a first portion 626 and a second portion 627. Each of the first and second portions 626, 627 comprise a U-shaped structure. The first portion 626 includes a first and second leg portion 601 and 602. At the left end, both legs are electrically coupled together and connected to a ground terminal 622. Likewise, the second portion 627 comprises two legs 603 and 604 connected together at tip 605 and forming the ground terminal 623. The two portions 626 and 627 are electrically coupled together via tuning elements 624 and 625, respectively. Each tuning element 624 and 625 is arranged between the respective legs 601, 602 and 603, 604. The tunable elements include a tunable resistor to change the overall impedance of the pair of tuning lines 620 to form a respective tunable differential transmission line segment. The pair of tuning lines 620 are arranged below or above the pair of signal lines 610 with a small insulation layer in between. The thickness of the insulation layer will constitute the coupling between the pair of tuning lines 620 and signal lines 610, respectively. The resulting structure is shown in the right portion of FIG. 6. Hence, as illustrated in top view on the right portion of FIG. 6, the pair of signal lines as well as the pair of tuning lines are stacked and arranged on top of each other. In these examples, the pair of tuning line segments are arranged below the respective layer of the signal line segments. The signal line segments are covering the respective tuning lines segments. However, stacking can also be reversed. In one example, the structure is embedded in an integrated circuit having the tuning lines 620 in one layer and the signal lines 610 in a neighboring layer. The tunable differential transmission line segment according to FIG. 6 is configured to be tuned by applying a respective control signal to the tunable elements. By doing so, the coupling between the pair of tuning lines 620 and the pair of signal lines 610 is changed, resulting in a change of the inductance in the pair of signal lines 610 and to a lesser degree in a change of the coupling capacitance between the pairs 620 and 610. The change of inductance causes a change in the group delay in the respective pair of signal lines 610. It should be noted that the structure is to be surrounded by a ground/supply plane with proper spacing once the structure is finalized. However, in the present example this ground plane is omitted in order to simplify the presentation of the embodiment. Further, the pair of tuning lines 620 may have other shapes or structures, e.g. V-shaped elongated strips or eye-shaped structure etc.

Figure 7:
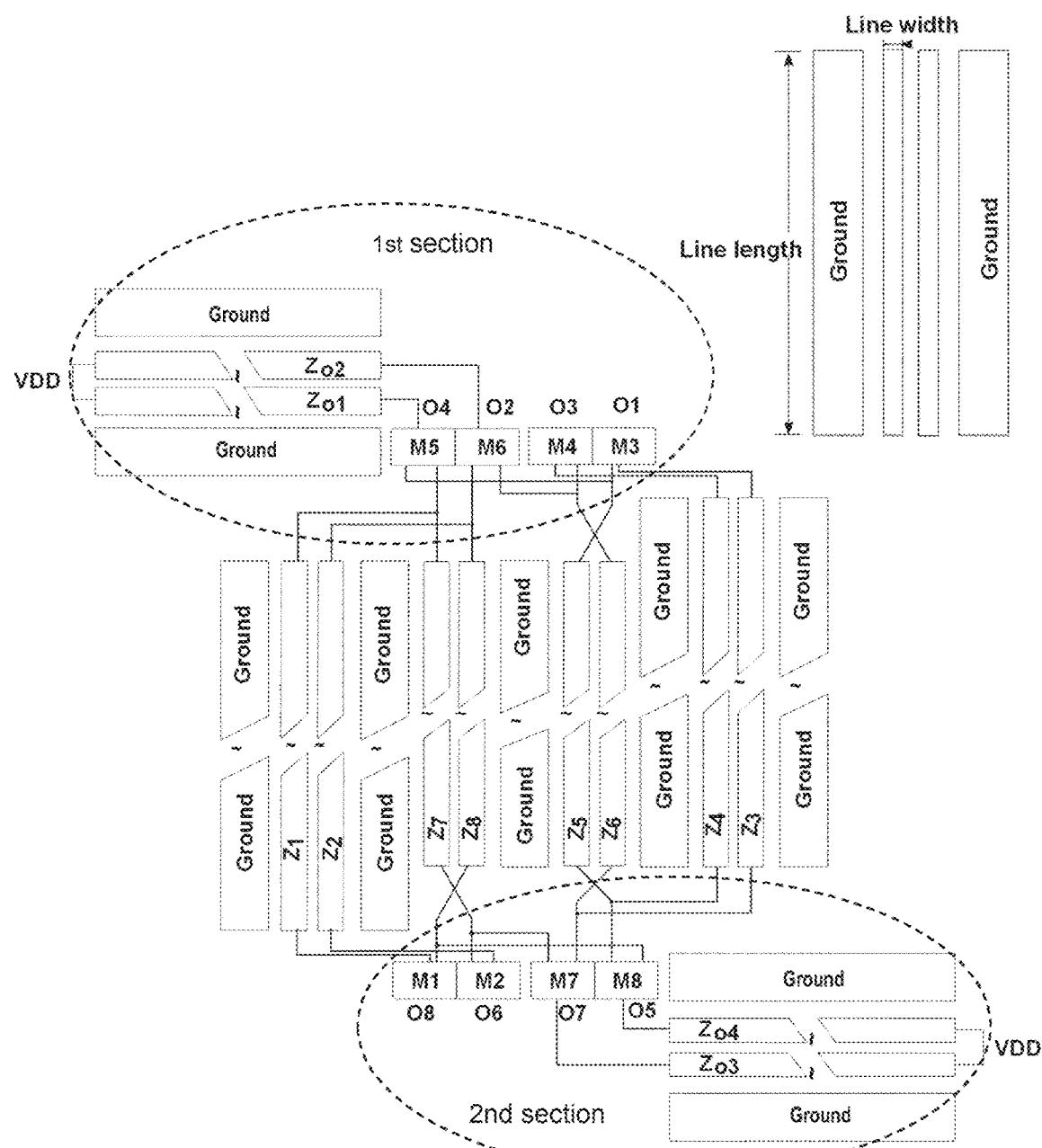
FIG. 7 is a schematic layout diagram illustrating an example arrangement of the components of the quadrature oscillator according to embodiments herein.

According to the embodiments herein, the quadrature oscillator 300 is integrated on a portion of a chip or a monolithic microwave integrated circuit. The components of the quadrature oscillator 300 are arranged and separated into two sections, a first section and a second section, on the portion of the chip. FIG. 7 is a schematic layout diagram illustrating an example arrangement of the components of the quadrature oscillator 300. The transmission lines and resonators may be implemented by coplanar differential waveguides, shown to the right of the figure, which may be implemented on chip e.g. into monolithic microwave integrated circuits. The width and length of each pair of transmission lines may be designed and tuned according to the design specifications and parameters, e.g. operating frequency, phase noise etc., of the quadrature oscillator 300.

As shown in FIG. 7, the first and second resonators $Z_{o1}$, $Z_{o2}$ and the third, fourth, fifth and sixth transistors $M_3$, $M_4$, $M_5$, $M_6$ are located in the first section. The third and fourth resonators $Z_{o3}$, $Z_{o4}$ and the first, second, seventh and eighth transistors $M_1$, $M_2$, $M_7$, $M_8$ are located in the second section. A first set of the quadrature signals $O_1$, $O_2$, $O_3$, $O_4$ may be provided from one side of the quadrature oscillator 300 located in the first section and a second set of the quadrature signals $O_5$, $O_6$, $O_7$, $O_8$ may be provided from the other side of the quadrature oscillator 300 located in the second section.

Figure 8:
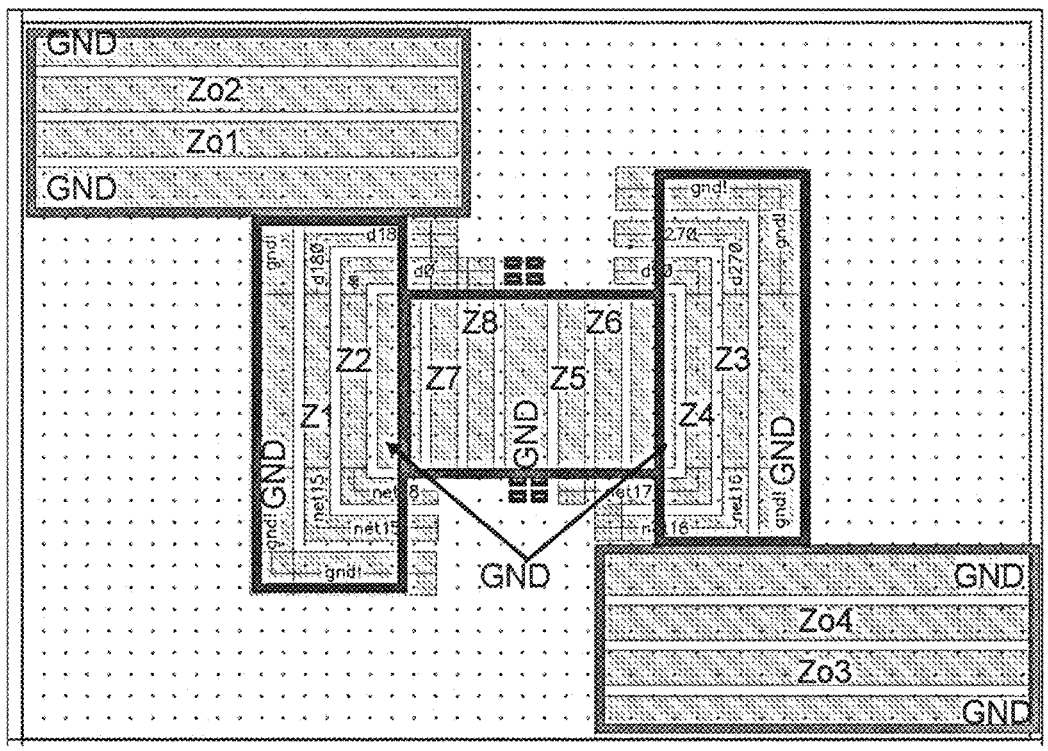
FIG. 8 shows an example floor plan layout of the quadrature oscillator shown in FIG. 7.

FIG. 8 shows an example floor plan layout corresponding to the schematic layout diagram shown in FIG. 7 with all components of the quadrature oscillator 300 placed, which may be used to manufacture the quadrature oscillator 300 on the chip. As can be seen the layout is compact and easily recognizable.

The resonance frequency of the quadrature oscillator 300 is set by the inductance and the parasitic capacitances at the resonator nodes. The parallel injection transistors $M_5$, $M_6$, $M_7$, $M_8$ make the two oscillator halves lock in quadrature, and their drain terminals are connected directly to the resonators. The gate terminals of the parallel injection transistors $M_5$, $M_6$, $M_7$, Ma get their signals from the other oscillator half through transmission lines. The gate terminals of the parallel injection transistors $M_5$, $M_6$, $M_7$, Ma are also connected to the gate terminals of the main transistor pairs $M_1$, $M_2$, $M_3$, $M_4$ which are differential cross-coupled, used to provide negative differential resistance to sustain oscillation. The drains of the cross-coupled main transistor pairs $M_1$, $M_2$, $M_3$, $M_4$, however, are connected to the resonator located on the other side, through transmission lines $Z_1$, $Z_2$, $Z_3$, $Z_4$. The transmission lines $Z_1$, $Z_2$, $Z_3$, $Z_4$ also act as an impedance transformation network increasing the impedance at the output of the main transistor pairs $M_1$, $M_2$, $M_3$, $M_4$, thereby increasing the power gain of the cross-coupled main transistor pairs $M_1$, $M_2$, $M_3$, $M_4$. These main transistors $M_1$, $M_2$, $M_3$, $M_4$ can then be made smaller without degrading the startup margin. The smaller devices will have less resistive and capacitive parasitics, enabling higher frequency of operation and boosting the phase noise figure of merit (FoM) considerably.

An example embodiment of the quadrature oscillator 300 operating at an oscillation frequency of 130 GHz has been implemented and simulated in a Complementary metal-oxide-semiconductor (CMOS) Fully Depleted Silicon on Insulator (FDSOI) design kit. MOS devices with mm-wave parasitic models and design kit differential transmission lines were used to account for layout effects. In this example embodiment of the quadrature oscillator 300, the main and parallel injection transistors have the size of 10 μm in width and 20 nm in length. The width of all transmission lines $Z_1$, $Z_2$, $Z_3$, $Z_4$, $Z_5$, $Z_6$, $Z_7$, $Z_8$ is 5 μm, the length of the transmission lines for the resonators $Z_{o1}$, $Z_{o2}$, $Z_{o3}$, $Z_{o4}$ is 100 um, while their width is 5 um, the length of the transmission lines $Z_1$, $Z_2$, $Z_3$, $Z_4$ for connecting the drain terminals to the respective resonators is 90 um, the length of the transmission lines $Z_5$, $Z_6$, $Z_7$, $Z_8$ for connecting the gate terminals to the respective resonators is 40 um.

Figure 9:
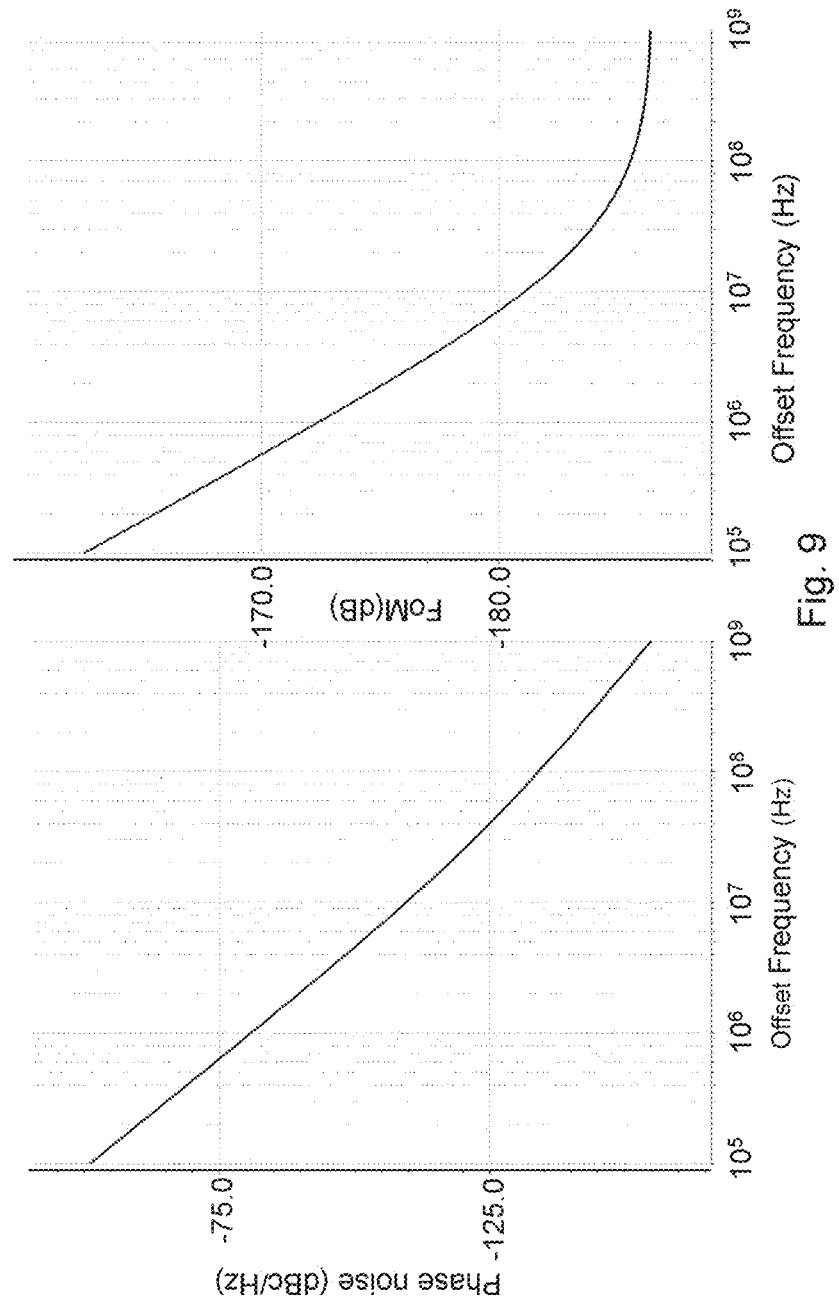
FIG. 9 are plots showing simulated phase noise and FoM of the quadrature oscillator according to embodiments herein.

FIG. 9 is diagram showing the phase noise and FoM curves plotted versus offset frequency. As can be seen in the figure the example embodiment of the quadrature oscillator 300 achieves an excellent FoM less than −186 dB. This is compared to −183 dB when the transmission lines $Z_1$, $Z_2$, $Z_3$, $Z_4$ for connecting the drain terminals are not used and the quadrature oscillator 300 is retuned to oscillate at the same frequency and amplitude. There is thus a 3 dB improvement in FoM when using the transmission lines, corresponding to a halved power consumption for achieving the same phase noise level. Further improving FoM is achievable with the prior art technique incorporated, e.g. a tail filtering technique widely used in voltage controlled oscillators (VCOs) presented in E. Hegazi, H. Sjoland and A. A. Abidi, "A filtering technique to lower LC oscillator phase noise," *IEEE Journal of Solid-State Circuits*, vol. 36, no. 12, pp. 1921-1930 December 2001, can be implemented in the quadrature oscillator 300.

Monte-Carlo simulations were performed to check the process and mismatch effect on the frequency and on IQI of the example embodiment of the quadrature oscillator 300. In 100 runs the mismatch was always less than 2° between the signals at the gates of the MOS devices. This yields an overall IQI of less than 6° for the signals $O_1$, $O_2$, $O_3$, $O_4$ and for $O_5$, $O_6$, $O_7$, $O_8$. The static part of 4° could be compensated for, e.g. by intentional routing imbalances when transporting the quadrature signal to a mixer where it is to be used.

Figure 10:
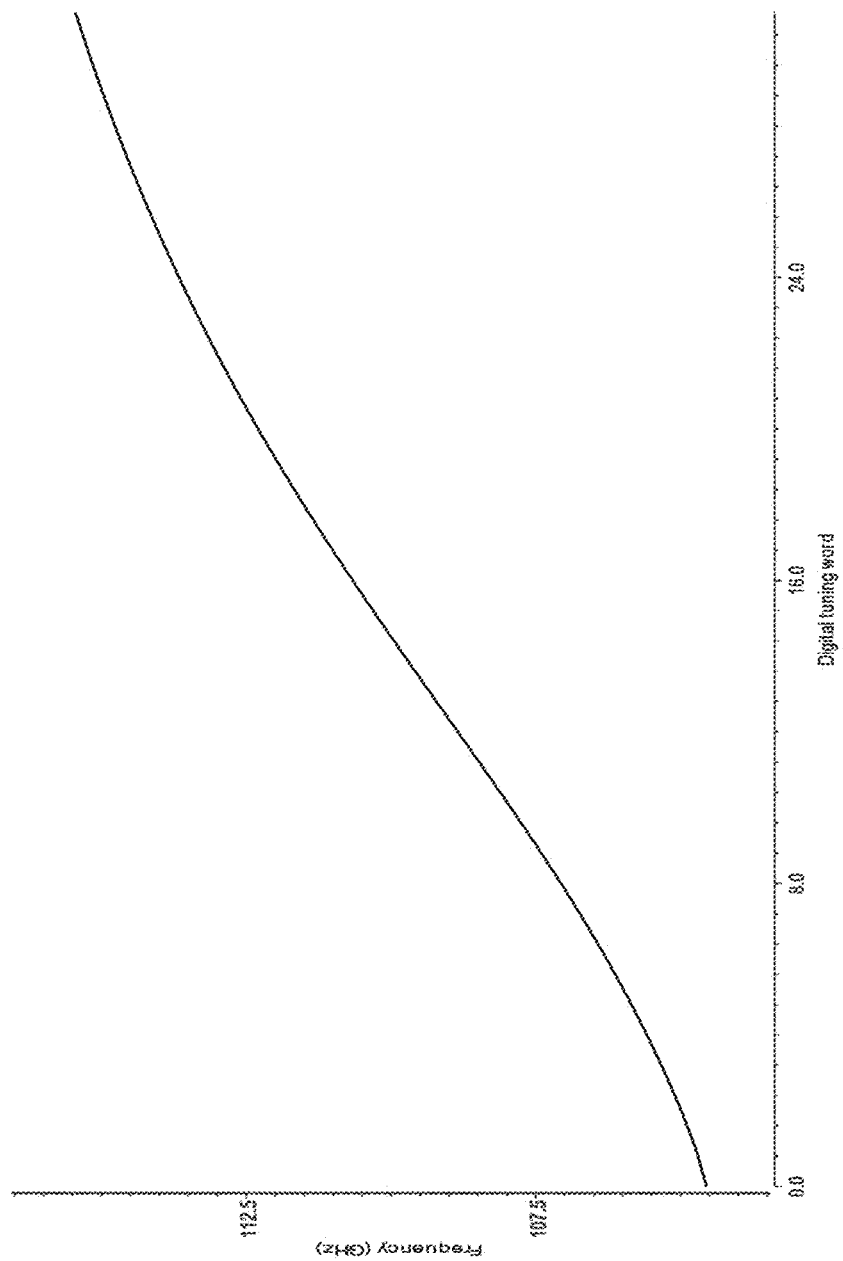
FIG. 10 is a plot showing simulated tuning range of the quadrature oscillator according to embodiments herein using tunable transmission lines.
Figure 11:
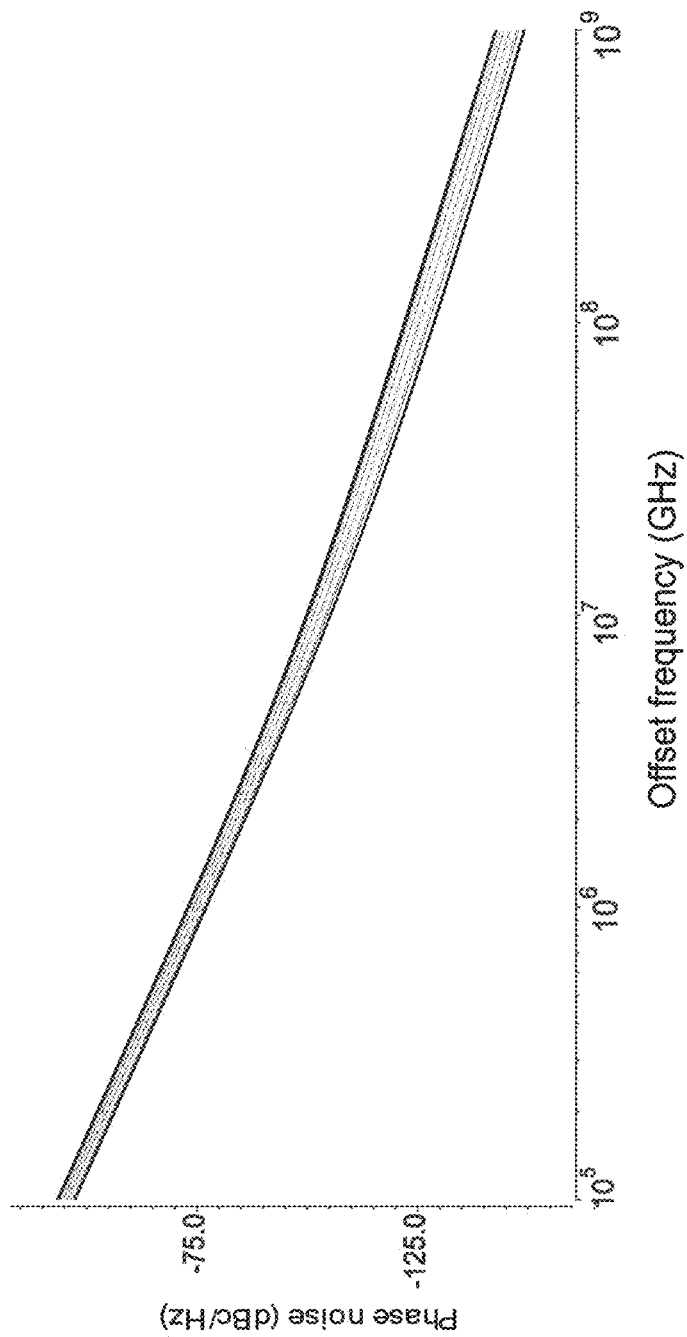
FIG. 11 are plots showing simulated phase noise of the tunable quadrature oscillator according to embodiments herein.
Figure 12:
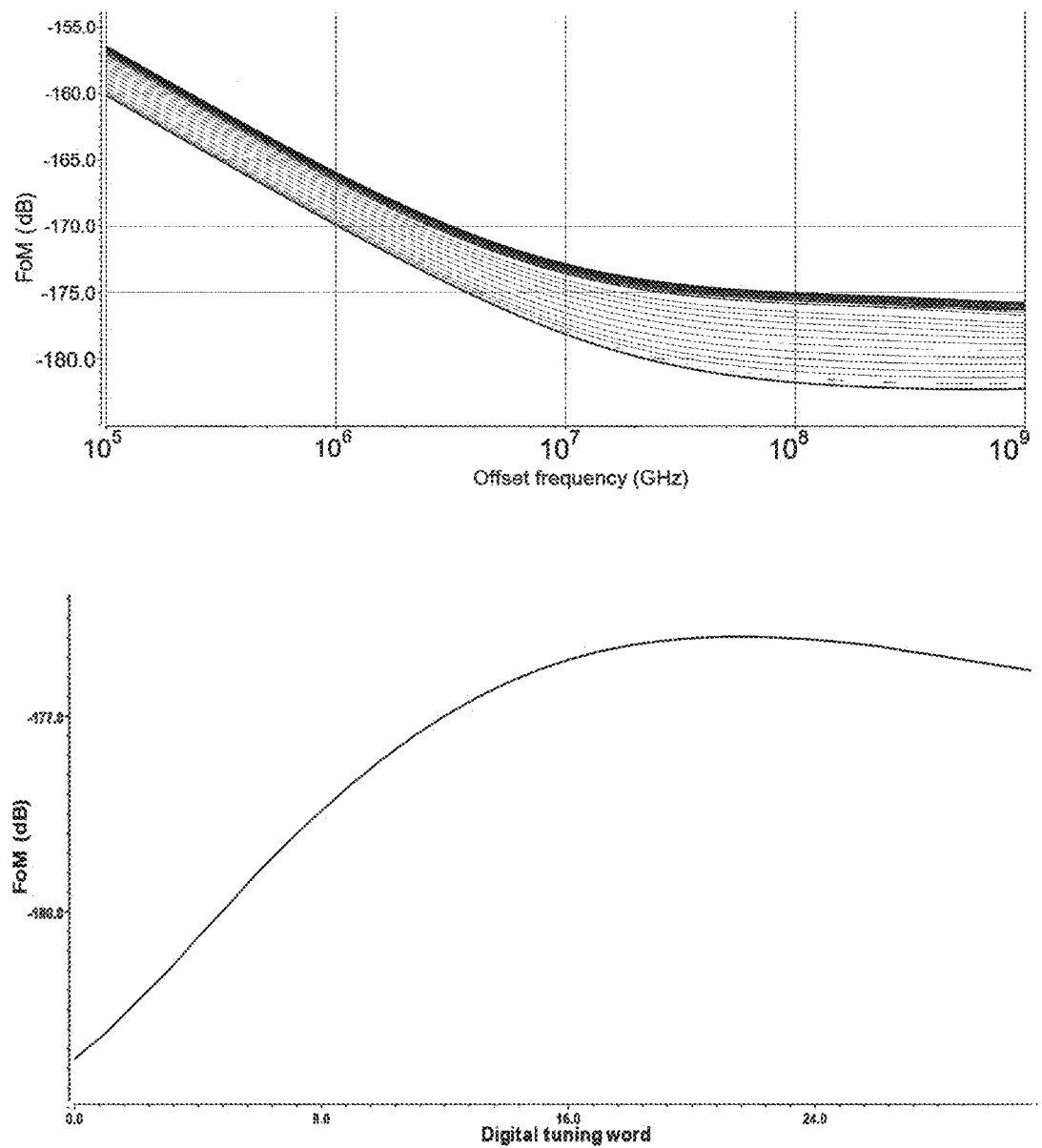
FIG. 12 are plots showing FoM of the tunable quadrature oscillator according to embodiments herein.

The example tunable differential transmission line segment shown in FIG. 6 has been used to implement a tunable quadrature oscillator according to embodiments herein and to check the overall performance of the oscillator. The tunable quadrature oscillator according to embodiments herein has been tuned to a center frequency of about 110 GHz with a tuning range of approximately 10%, see FIG. 10. The phase noise is shown in FIG. 11 and the FoM plots are shown in FIG. 12, where the top plot shows the FoM of the tunable quadrature oscillator versus the offset frequency and the bottom plot shows the FoM at 1 GHz offset frequency. The tunable quadrature oscillator achieves an FoM in the range-176 to −182 dB. The loss in FoM is expected when introducing tuning and consequently a reduction of the Q factor of the resonators. The tunable quadrature oscillator according to embodiments herein was also crudely compared to the conventional quadrature oscillator where the transmission lines $Z_1$, $Z_2$, $Z_3$, $Z_4$ were removed. The FoM of the tunable quadrature oscillator according to embodiments herein is improved by at least 1.3 dB and up to 2 dB across the whole tuning range. Moreover, the tuning range of the tunable quadrature oscillator is improved from 8.7% to 9.7% because the transmission lines $Z_1$, $Z_2$, $Z_3$, $Z_4$ are also tunable.

Figure 13:
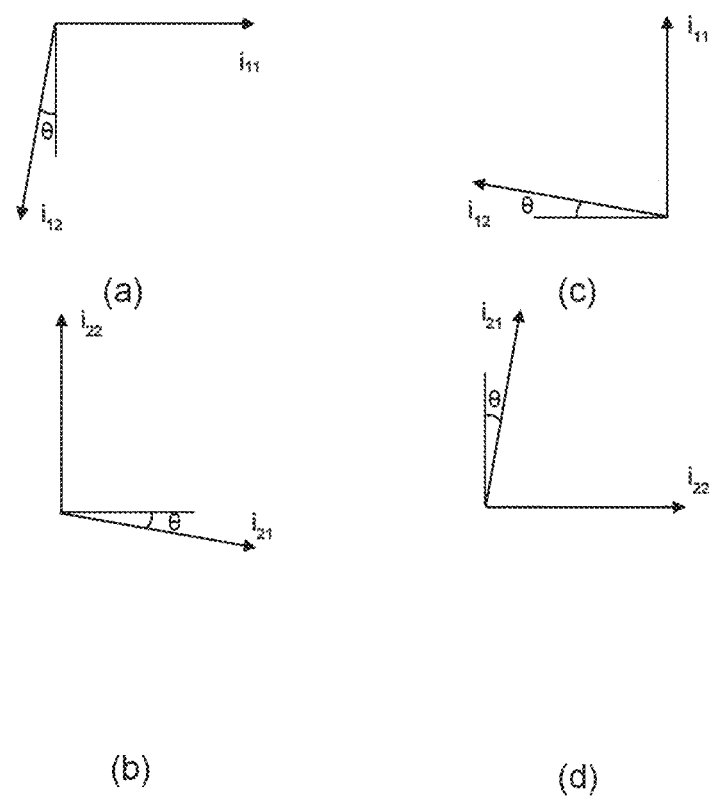
FIG. 13 showing phasors in an idealized quadrature oscillator.

Regarding suppression of one quadrature mode, it will occur when the other quadrature mode has higher loop-gain. FIG. 13 illustrates the currents injected into the two pairs of the resonators from the cross-coupled main transistor pairs and from the parallel injection transistor pairs. The parallel injection transistor pair $M_5$, $M_6$ inject current from the first resonator pair $Z_{o1}$, $Z_{o2}$ to the second resonator pair $Z_{o3}$, $Z_{o4}$ without sign reversal, whereas when the parallel injection transistor pair $M_7$, $M_8$ inject current from the second resonator pair $Z_{o3}$, $Z_{o4}$ to the first resonator pair $Z_{o1}$, $Z_{o2}$, it reverses the current sign by its differential cross connection. It is assumed that the current phasors from the cross-coupling main transistor pair are phase shifted by an angle θ with respect to its relation to the current phasors from the parallel injection transistor pair in an oscillator without the additional transmission lines. The transmission lines $Z_1$, $Z_2$, $Z_3$, $Z_4$ at the drain terminals will cause a positive angle θ.

The left top figure (a) are the currents injected into the first resonator pair $Z_{o1}$, $Z_{o2}$ in the suppressed mode. The current $i_{11}$ is from the cross-coupled first resonator pair, and $i_{12}$ is the current coupled from the second resonator pair $Z_{o3}$, $Z_{o4}$ to the first resonator pair $Z_{o1}$, $Z_{o2}$. The left bottom figure (b) are the currents injected into the second resonator pair $Z_{o3}$, $Z_{o4}$ in the same mode. The current $i_{22}$ is from the cross-coupled second resonator pair $Z_{o3}$, $Z_{o4}$, and the current $i_{21}$ is coupled from the first resonator pair $Z_{o1}$, $Z_{o2}$ to the second resonator pair $Z_{o3}$, $Z_{o4}$. As can be seen $i_{21}$ is not sign reversed with respect to $i_{11}$, but $i_{12}$ is sign reversed with respect to $i_{22}$. It can also be seen that the coupled currents 112 and $i_{21}$ are rotated clockwise by the angle θ.

The right figures (c) and (d) are corresponding currents injected into the resonators in the dominant mode. It is clear from the figure that the rotation clockwise by θ makes the phase difference between the two current phasors smaller in this mode, resulting in more signal current, whereas it makes the phase difference larger in the other mode. When θ=0 the phase difference in both modes is ideally equal to 90 degrees, and both modes are equally probable. As θ is increased, by making the transmission lines $Z_1$, $Z_2$, $Z_3$, $Z_4$ longer, the mode to the right in the figure will become dominant, and the oscillator behavior will then be more stable and predictable.

Figure 14:
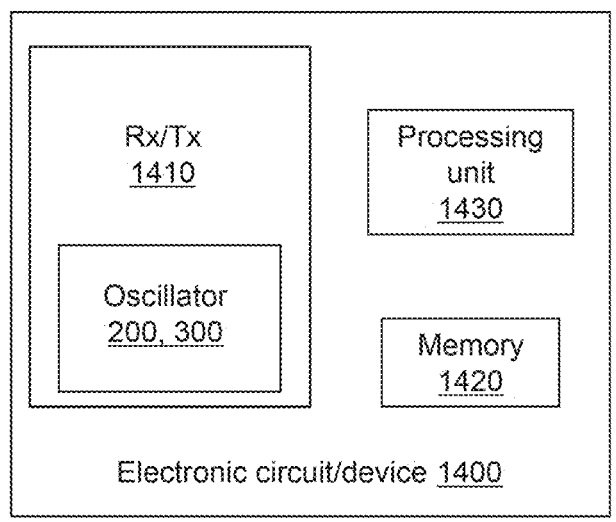
FIG. 14 is a block diagram illustrating an electronic device in which embodiments herein may be implemented.

The quadrature oscillator 300 according to the embodiments herein may be employed in various electronic circuits or devices where quadrature signals are needed. FIG. 14 shows a block diagram for an electronic device 1400. The electronic device 1400 may comprise a transmitter, a receiver or both, i.e. a transceiver Rx/Tx 1410, which may comprises a quadrature oscillator 300. The electronic device 1400 may comprise other units, where a memory 1420, a processing unit 1430 are shown. The electronic device 1400 may be a user equipment or a mobile device, a wireless communication device, a radio base station, an access point, a relay or a repeater for a cellular communication system.

Although the quadrature oscillator 300 shown in FIG. 3 is implemented using NMOS transistors, PMOS, CMOS, and bi-polar implementation are also possible, as well as implementations using other types of field-effect transistors (FETs) than MOS transistors. Those skilled in the art will understand that the quadrature oscillator 300 according to embodiments herein may be implemented by any semiconductor technology, e.g. Bi-polar, NMOS, PMOS, CMOS, FET or Micro-Electro-Mechanical Systems (MEMS) technology etc.

The quadrature oscillator 300 is suitable for integration on an integrated circuit. Hence, according to some embodiments, there is provided an integrated circuit comprising one or more quadrature oscillator 300 according to the embodiments herein.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope defined by the appended claims.

The invention claimed is:

1. A quadrature oscillator for generating a first set of differential quadrature signals and a second set of differential quadrature signals, the quadrature oscillator comprising:
   a first, a second, a third, a fourth, a fifth, a sixth, a seventh, and an eighth transistor; and
   a first, a second, a third, and a fourth resonator; and wherein
      gate terminals of the first transistor and the eighth transistor are connected to each other;
      gate terminals of the second transistor and the seventh transistor are connected to each other;
      gate terminals of the third transistor and the fifth transistor are connected to each other;
      gate terminals of the fourth transistor and the sixth transistor are connected to each other;

a drain terminal of the fifth transistor is connected to a first terminal of the first resonator;
a drain terminal of the sixth transistor is connected to a first terminal of the second resonator;
a drain terminal of the seventh transistor is connected to a first terminal of the third resonator;
a drain terminal of the eighth transistor is connected to a first terminal of the fourth resonator;
a drain terminal of the first transistor is connected to the first terminal of the first resonator through a first transmission line;
a drain terminal of the second transistor is connected to the first terminal of the second resonator through a second transmission line;
a drain terminal of the third transistor is connected to the first terminal of the third resonator through a third transmission line;
a drain terminal of the fourth transistor is connected to the first terminal of the fourth resonator through a fourth transmission line;
the gate terminal of the fifth transistor is connected to the first terminal of the fourth resonator through a fifth transmission line;
the gate terminal of the sixth transistor is connected to the first terminal of the third resonator through a sixth transmission line;
the gate terminal of the seventh transistor is connected to the first terminal of the first resonator through a seventh transmission line; and
the gate terminal of the eighth transistor is connected to the first terminal of the second resonator through an eighth transmission line.

2. The quadrature oscillator according to claim 1, wherein the first, the second, the third, and the fourth resonator are transmission lines acting as inductors.

3. The quadrature oscillator according to claim 1, wherein the first, the second, the third, and the fourth resonator are spiral inductors.

4. The quadrature oscillator according to claim 1, wherein the first and the second resonator are implemented as a first differential spiral inductor, and the third and the fourth resonator are implemented as a second differential spiral inductor.

5. The quadrature oscillator according to claim 1, wherein the first, the second, the third, and the fourth resonator are tunable.

6. The quadrature oscillator according to claim 1, wherein the first, the second, the third, and the fourth resonator comprises tunable capacitors or varactors.

7. The quadrature oscillator according to claim 1, wherein the transmission lines at the drain terminals of the first, the second, the third, and the fourth transistor are tunable.

8. The quadrature oscillator according to claim 1, wherein the transmission lines at the gate terminals of the fifth, the sixth, the seventh, and the eighth transistor are tunable.

9. The quadrature oscillator according to claim 1, wherein the quadrature oscillator is tuned to generate the first and second sets of differential quadrature signals with frequency of 30-100 GHz or over 100 GHz.

10. The quadrature oscillator according to claim 1, wherein the transistors are N-channel metal-oxide-semiconductor (NMOS) transistors or bipolar junction NPN transistors, and source/emitter terminals of the transistors are connected to a signal ground (GND) directly or through an impedance, and wherein second terminals of the resonators are connected to a power supply node (VDD).

11. The quadrature oscillator according to claim 1, wherein the transistors are P-channel metal-oxide-semiconductor (PMOS) transistors or bipolar junction PNP transistors, and source/emitter terminals of the transistors are connected to a power supply node (VDD) directly or through an impedance, and wherein second terminals of the resonators are connected to a signal ground (GND).

12. The quadrature oscillator according to claim 1, wherein the quadrature oscillator is integrated on a portion of a chip, and wherein components of the quadrature oscillator are arranged and separated into two sections, a first section and a second section, on the portion of the chip, and wherein:
the first and the second resonator and the third, the fourth, the fifth, and the sixth transistor are located in the first section;
the third and the fourth resonator and the first, the second, the seventh, and the eighth transistor are located in the second section; and wherein
the first set of differential quadrature signals is provided from one side of the quadrature oscillator located in the first section; and
the second set of differential quadrature signals is provided from the other side of the quadrature oscillator located in the second section.

13. An integrated circuit comprising:
a quadrature oscillator for generating a first set of differential of quadrature signals and a second set of differential quadrature signals, the quadrature oscillator comprising:
a first, a second, a third, a fourth, a fifth, a sixth, a seventh, and an eighth transistor; and
a first, a second, a third, and a fourth resonator; and wherein
gate terminals of the first transistor and the eighth transistor are connected to each other;
gate terminals of the second transistor and the seventh transistor are connected to each other;
gate terminals of the third transistor and the fifth transistor are connected to each other;
gate terminals of the fourth transistor and the sixth transistor are connected to each other;
a drain terminal of the fifth transistor is connected to a first terminal of the first resonator;
a drain terminal of the sixth transistor is connected to a first terminal of the second resonator;
a drain terminal of the seventh transistor is connected to a first terminal of the third resonator;
a drain terminal of the eighth transistor is connected to a first terminal of the fourth resonator;
a drain terminal of the first transistor is connected to the first terminal of the first resonator through a first transmission line;
a drain terminal of the second transistor is connected to the first terminal of the second resonator through a second transmission line;
a drain terminal of the third transistor is connected to the first terminal of the third resonator through a third transmission line;
a drain terminal of the fourth transistor is connected to the first terminal of the fourth resonator through a fourth transmission line;
the gate terminal of the fifth transistor is connected to the first terminal of the fourth resonator through a fifth transmission line;

the gate terminal of the sixth transistor is connected to the first terminal of the third resonator through a sixth transmission line;

the gate terminal of the seventh transistor is connected to the first terminal of the first resonator through a seventh transmission line; and the gate terminal of the eighth transistor is connected to the first terminal of the second resonator through an eighth transmission line;

wherein the quadrature oscillator is integrated on a portion of a chip, and wherein components of the quadrature oscillator are arranged and separated into two sections, a first section and a second section, on the portion of the chip, and wherein:

the first and the second resonator and the third, the fourth, the fifth, and the sixth transistor are located in the first section; and the third and the fourth resonator and the first, the second, the seventh, and the eighth transistor are located in the second section; and wherein:

the first set of differential quadrature signals is provided from one side of the quadrature oscillator located in the first section; and the second set of differential quadrature signals is provided from the other side of the quadrature oscillator located in the second section.

14. A transceiver comprising:
a quadrature oscillator for generating a first set of differential quadrature signals and a second set of differential quadrature signals, the quadrature oscillator comprising:

a first, a second, a third, a fourth, a fifth, a sixth, a seventh, and an eighth transistor; and a first, a second, a third, and a fourth resonator; and wherein:

gate terminals of the first transistor and the eighth transistor are connected to each other;

gate terminals of the second transistor and the seventh transistor are connected to each other;

gate terminals of the third transistor and the fifth transistor are connected to each other;

gate terminals of the fourth transistor and the sixth transistor are connected to each other;

a drain terminal of the fifth transistor is connected to a first terminal of the first resonator;

a drain terminal of the sixth transistor is connected to a first terminal of the second resonator;

a drain terminal of the seventh transistor is connected to a first terminal of the third resonator;

a drain terminal of the eighth transistor is connected to a first terminal of the fourth resonator;

a drain terminal of the first transistor is connected to the first terminal of the first resonator through a first transmission line;

a drain terminal of the second transistor is connected to the first terminal of the second resonator through a second transmission line;

a drain terminal of the third transistor is connected to the first terminal of the third resonator through a third transmission line;

a drain terminal of the fourth transistor is connected to the first terminal of the fourth resonator through a fourth transmission line;

the gate terminal of the fifth transistor is connected to the first terminal of the fourth resonator through a fifth transmission line;

the gate terminal of the sixth transistor is connected to the first terminal of the third resonator through a sixth transmission line;

the gate terminal of the seventh transistor is connected to the first terminal of the first resonator through a seventh transmission line; and the gate terminal of the eighth transistor is connected to the first terminal of the second resonator through an eighth transmission line.

15. An electronic device comprising:
a quadrature oscillator for generating a first set of differential quadrature signals and a second set of differential quadrature signals, the quadrature oscillator comprising:

a first, a second, a third, a fourth, a fifth, a sixth, a seventh, and an eighth transistor; and a first, a second, a third, and a fourth resonator; and wherein:

gate terminals of the first transistor and the eighth transistor are connected to each other;

gate terminals of the second transistor and the seventh transistor are connected to each other;

gate terminals of the third transistor and the fifth transistor are connected to each other;

gate terminals of the fourth transistor and the sixth transistor are connected to each other;

a drain terminal of the fifth transistor is connected to a first terminal of the first resonator;

a drain terminal of the sixth transistor is connected to a first terminal of the second resonator;

a drain terminal of the seventh transistor is connected to a first terminal of the third resonator;

a drain terminal of the eighth transistor is connected to a first terminal of the fourth resonator;

a drain terminal of the first transistor is connected to the first terminal of the first resonator through a first transmission line;

a drain terminal of the second transistor is connected to the first terminal of the second resonator through a second transmission line;

a drain terminal of the third transistor is connected to the first terminal of the third resonator through a third transmission line;

a drain terminal of the fourth transistor is connected to the first terminal of the fourth resonator through a fourth transmission line;

the gate terminal of the fifth transistor is connected to the first terminal of the fourth resonator through a fifth transmission line;

the gate terminal of the sixth transistor is connected to the first terminal of the third resonator through a sixth transmission line;

the gate terminal of the seventh transistor is connected to the first terminal of the first resonator through a seventh transmission line; and the gate terminal of the eighth transistor is connected to the first terminal of the second resonator through an eighth transmission line.

16. The electronic device according to claim 15, wherein the electronic device is one of:
a base station;
an access point;
a relay;
a repeater; and a wireless communication device for a cellular communication system.

\* \* \* \* \*